(12) United States Patent
Mimura et al.

(10) Patent No.: US 7,916,241 B2
(45) Date of Patent: Mar. 29, 2011

(54) METHOD FOR MANUFACTURING OPTICAL ELEMENT

(75) Inventors: Koji Mimura, Kawasaki (JP); Ken Sumiyoshi, Kawasaki (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 540 days.

(21) Appl. No.: 11/866,526

(22) Filed: Oct. 3, 2007

(65) Prior Publication Data

US 2008/0089068 A1    Apr. 17, 2008

(30) Foreign Application Priority Data

Oct. 13, 2006   (JP) ................................ 2006-280586
Aug. 22, 2007   (JP) ................................ 2007-215887

(51) Int. Cl.
*G02F 1/1335*    (2006.01)
*F21V 11/16*     (2006.01)

(52) U.S. Cl. ......................................... 349/62; 362/292

(58) Field of Classification Search .................. 362/290, 362/292; 349/110, 62

See application file for complete search history.

(56) References Cited

U.S. PATENT DOCUMENTS 3,919,559 A     11/1975  Stevens
5,568,291 A  *  10/1996  Murata et al. ................ 349/110

FOREIGN PATENT DOCUMENTS

| JP | 5-34669 A      | 2/1993 |
| JP | 2652072 B2     | 5/1997 |
| JP | 2004-117887 A  | 4/2004 |
| JP | 2006-79978 A   | 3/2008 |
| JP | 2006-119365 A  | 5/2008 |
| KR | 88-000500 B1   | 4/1988 |
| KR | 2000-0057318 A | 9/2000 |
| KR | 2003-0048148 A | 6/2003 |
| KR | 2003-0072397 A | 9/2003 |
| WO | 2005/057255 A2 | 6/2005 |

* cited by examiner

*Primary Examiner* — David Nelms
*Assistant Examiner* — Nathanael R Briggs
(74) *Attorney, Agent, or Firm* — Sughrue Mion, PLLC

(57) ABSTRACT

An optical element manufacturing method according to the present invention includes: disposing a mask on a transparent photosensitive resin; patterning said transparent resin by applying an exposure light to said transparent photosensitive resin through said mask to form a transparent layer; forming a light absorbing layer by filling a gap in the transparent layer with a black curable resin; and illuminating a mask surface of the mask with the exposure light at an angle.

7 Claims, 18 Drawing Sheets

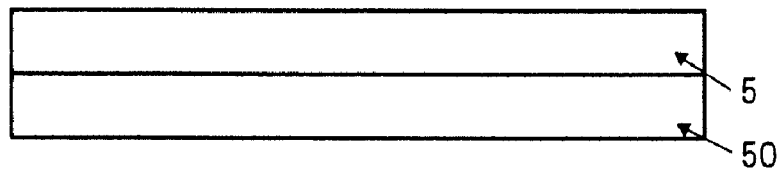
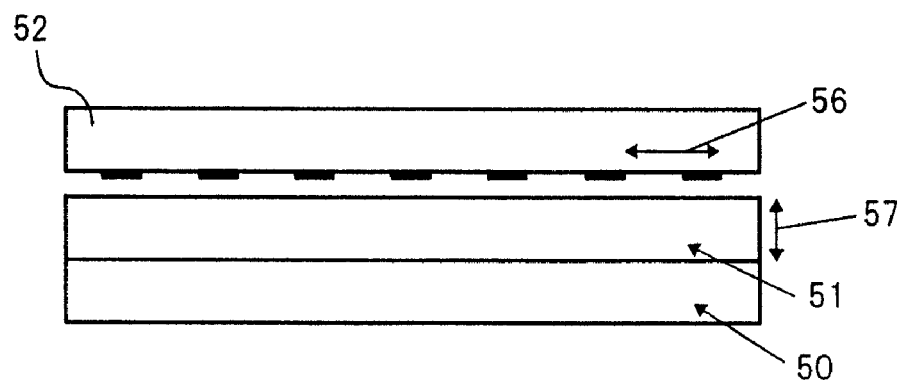
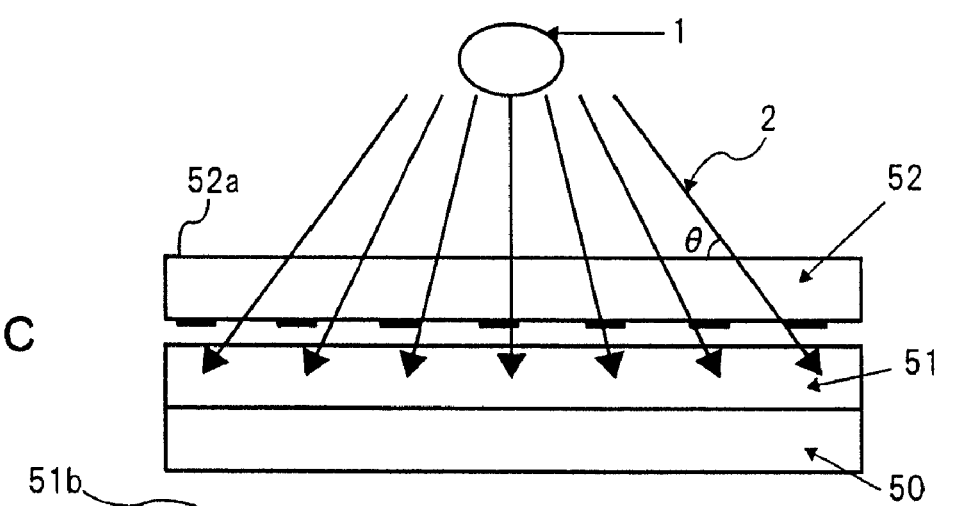
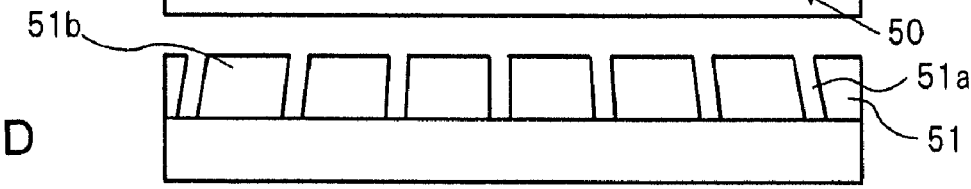
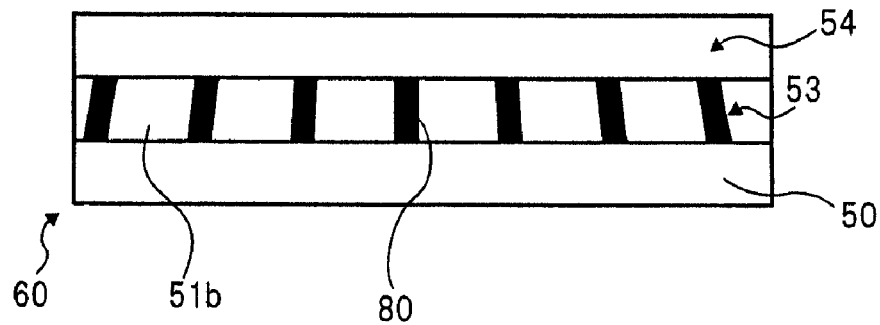
Fig. 3A
Fig. 3B
Fig. 3C
Fig. 3D
Fig. 3E

METHOD FOR MANUFACTURING OPTICAL ELEMENT

BACKGROUND OF THE INVENTION

1. Field of the Invention

The present invention relates to a method for manufacturing an optical element called a microlouver which restricts the range of transmitted light in the direction of emission. The present invention also relates to a display apparatus such as liquid-crystal display (LCD), a plasma display, an illuminating optical apparatus and electronic apparatus that have an optical element manufactured by the optical element manufacturing method.

2. Description of the Related Art

Liquid-crystal displays are used as displays for various information processing devices such as mobile phones, personal digital assistants (PDAs), automatic teller machines (ATMs), and personal computers. Liquid-crystal displays with wide viewing angles have been put into practical use in recent years. With the increase in the size and versatility of liquid-crystal displays, there is a growing demand for liquid-crystal displays having various light distribution characteristics. In particular, there are growing demands to restrict viewing angles so that the display is not visible to other persons to prevent information leakage and to prevent light from being emitted in unwanted directions.

To meet these demands, displays equipped with a microlouver to restrict the viewing angle (or light emission range) have been proposed and some of them have been brought into practical use.

When a viewer views a large display from directly in front of around the center of the display, the center portion of the large display is bright and an image displayed in the portion is visible to the viewer. On the other hand, the regions near the edges of the large display are dark and the image displayed in those regions is obscured.

As a result, the viewability of the entire image displayed on the large display to the viewer can be degraded. This is because, as shown in FIG. 1., the light absorbing layer of the microlouver 201 provided in front of display 200 is formed substantially perpendicular to the surface of display 200

In-vehicle displays require customized light distribution characteristics. In-vehicle displays are used as navigation monitors or television monitors. Such in-vehicle displays are often located in the center portion of a dashboard. If the viewing angle of the upper side of the display is wide, an image on the display is reflected in the windshield, which can interfere with driving of the vehicle. Therefore, the viewing angle in the vertical directions must be limited. Navigation information displayed is primarily required by the driver and a passenger located in the passenger seat. Therefore, the in-vehicle navigation display requires a microlouver that can distribute light to the driver and passenger seats.

On the other hand, a television monitor should be easily visible to passengers other than the driver. Therefore, the in-vehicle display of a television monitor requires microlouver 301 that distributes light to the passenger located in passenger seat 310c and to passengers in rear seat 310b and that does not distributes light to driver 310a. U.S. Pat. No. 3,919,559 discloses a method for manufacturing a microlouver having a predetermined light distribution characteristic. First, a member that consists of a transparent resin layer and an opaque light absorbing layer arranged at the same angle are provided and then curved into an arch. Then, pressure is applied to the curved member to flatten the member again. As a result of these steps, a microlouver having a light distribution characteristic that converges light to a predetermined position can be provided.

However, the manufacturing method disclosed in U.S. Pat. No. 3,919,559 which applies heat and pressure to a temporarily curved member to flatten it again to slant the light absorbing layer produces a density distribution in the transparent resin layer portions during the stage at which the light absorbing layer is slanted. That is, the density of the transparent resin layer portions increases in a region where the distance between adjacent light absorbing layer portions is reduced by the slant of the light absorbing layer portions. On the other hand, the density of the transparent resin layer portions decreases in the region where the gap between adjacent light absorbing layers portions is wide. That is, the manufacturing method disclosed in U.S. Pat. No. 3,919,559 requires consideration of the effect of the density of the transparent resin layer portions when customizing light distribution characteristics. In addition, the manufacturing method disclosed in U.S. Pat. No. 3,919,559 mechanically transforms the member under heat and pressure. Therefore, microlouvers can be damaged during manufacturing, resulting in low yields. Furthermore, the mechanical transformation of the members under heat and pressure can curve the interface surface between the transparent layer and the light absorbing layer of the microlouver and therefore it can become difficult to ensure flatness of the interface surface.

SUMMARY OF THE INVENTION

An object of the present invention is to provide an optical element manufacturing method that is capable of manufacturing an optical element having predetermined light distribution characteristics, without creating a density distribution in a transparent layer and without reducing yields, and that is capable of ensuring the flatness of the interface surface between a transparent layer of a microlouver and a light absorbing layer. Another object is to provide an illuminating optical apparatus, a display apparatus, and an electronic apparatus including an optical element manufactured by the manufacturing method according to the present invention. Yet another object is to provide an optical element having predetermined light distribution characteristics.

An optical element manufacturing method according to the present invention is a method in which a transparent layer and a light absorbing layer are alternately arranged in a plane and in which the light absorbing layer restricts the range of light transmitted through the transparent layer in the light emitting direction, including: disposing a mask on a transparent photosensitive resin; patterning the transparent resin by applying an exposure light to the transparent photosensitive resin through the mask to form a transparent layer; forming a light absorbing layer by filling a gap in the transparent layer with a black curable resin; and illuminating a mask surface of the mask with the exposure light at an angle; wherein the transparent layer and the light absorbing layer are arranged alternately in a plane and the range of light transmitted through the transparent layer in the direction of the emission of light is restricted by the light absorbing layer.

According to the manufacturing method described above, the exposure light enters the transparent photosensitive resin through the mask at an angle. Therefore, a transparent layer having a surface angled with respect to the surface of the mask is formed on the transparent photosensitive resin. By filling the gap between the transparent layer portions having the angled surfaces with a black curable resin, a light absorbing layer is formed. Because the angled transparent layer portions and light absorbing layer portions of the optical element are formed without being heated and pressured, density in the transparent layer portions is not changed and the optical element is not strained during the manufacturing process.

According to the manufacturing method of the present invention, the slanted light absorbing layer portions are formed by applying exposure light to the transparent photosensitive resin at an angle and therefore the layers do not need to be mechanically transformed or heated or pressured. Therefore density in the transparent layer portions is not changed and reduction in yields due to damage to the optical element can be prevented.

BRIEF DESCRIPTION OF THE DRAWINGS

FIGS. 3A, 3B, 3C, 3D, and 3E are diagrams schematically showing the manufacturing process of a microlouver according to a first embodiment of the present invention, illustrating a process for forming a transparent photosensitive resin layer on a transparent substrate;

FIGS. 4A, 4B, 4C and 4D are diagrams showing another manufacturing process of a microlouver according to the first embodiment of the present invention;

DETAILED DESCRIPTION OF THE PREFERRED EMBODIMENTS

First Embodiment

FIGS. 3A to 3E schematically show the manufacturing process of a microlouver, which is an optical element, according to a first embodiment of the present invention.

First, transparent photosensitive resin layer 51 is formed on transparent substrate 50 (see FIG. 3A). Transparent photosensitive resin layer 51 can be formed by using a film forming method such as slit die coating, wire coating, dry film transfer, and splay coating. Transparent substrate 50 is made of glass, PET (polyethylene terephthalate), or PC (polycarbonate). An amplified photoresist (marketed as SU-8) from Kayaku MicroChem Corporation is used for transparent photosensitive resin layer 51. The photoinitiator contained in transparent photosensitive resin layer 51 is an epoxy-type (glycidyl ether derivative of bisphenol-A novolac) negative resist whose photoinitiator generates acid upon exposure to ultraviolet light. This proton acid functions as a catalyst to polymerize a curable monomer. Transparent photosensitive resin layer 51 exhibits a highly transparent characteristic in the visible spectrum. The curable monomer contained in transparent photosensitive resin 51 has a relatively low molecular weight before curing, and therefore is easily soluble in a solvent such as cyclopentanone, propylene glycol methyl ether acetate (PEGMEA), gamma butyl lactone (GBL), and isobutyl ketone (MIBK). Accordingly, a film made of the monomer can be formed thick. In addition, transparent photosensitive resin 51 has very high light transmittance at wavelengths in the near-ultraviolet region. Therefore even a thick film of transparent photosensitive resin 51 can transmit ultraviolet light. In the first embodiment, thickness 57 of transparent photosensitive resin 51 is in the range between 100 µm and 200 µm (see FIG. 3B).

Because of these characteristics, a pattern with an aspect ratio of as high as 5 or more can be formed in transparent photosensitive resin 51. Furthermore, because the curable monomer contains many functional groups, cured transparent photosensitive resin 51 functions as an ultra high-density bridge and is thermally and chemically very stable. Therefore, transparent photosensitive resin 51 can readily be processed after patterning. Of course, transparent photosensitive resin 51 used in the present invention is not limited to transparent photosensitive resin 51 (product name: SU-8) given above. Any photo-curable material may be used that has characteristics similar to those described above.

Figure 3F:
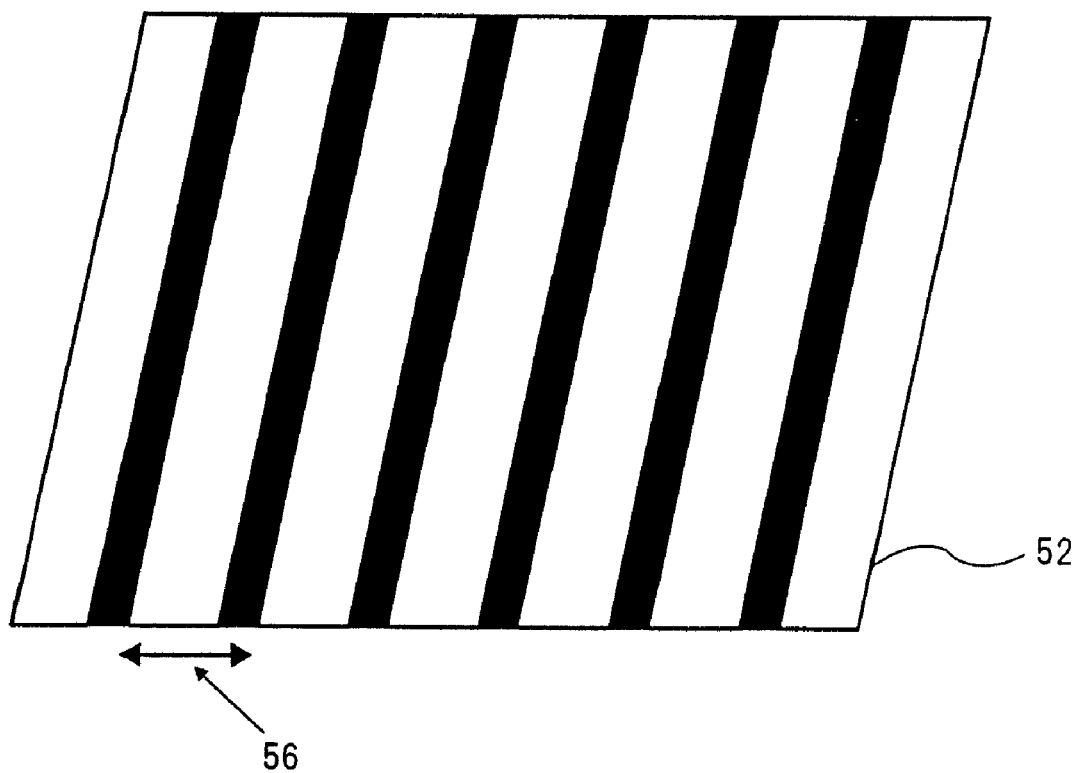
FIG. 3F shows the geometry of a mask.

Then, mask 52 is used to pattern transparent photosensitive resin 51 (see FIG. 3B). The geometry of the mask is a lineand-space pattern as shown in FIG. 3F. Mask pitch 56 is in the range between 50 μm and 100 μm.

The patterning step is a well-known in the photolithography field. In the embodiment, point light source 1 is used in order to provide scattering light 2. Point light source 1 is positioned so that scattering light 2 is applied from the center of mask 52 toward the edges of mask 52. Point light source 1 in the embodiment is a UV light source. For example, UV light having a wavelength of 365 nm is applied as exposure light. Because scattering light 2 that is emitted from point light source 1 is diverged toward mask 52, scattering light 2 impinges on mask surface 52*a* of mask 52 at an angle, except for the center of mask 52.

Exposure light emitted from point light source 1 passes through mask 52 at an angle (see FIG. 3C) and forms pattern 51*b* on transparent photosensitive resin layer 51 that is slanted in the direction that converges towards point light source 1. That is, pattern 51*b* is formed substantially perpendicular to the surface of transparent photosensitive resin layer 51 at the center of transparent photosensitive resin layer 51 and the angle of incidence θ is smaller toward the edges of transparent photosensitive resin layer 51 (see FIG. 3D).

Then, the gaps between transparent layer portions 51*b* of patterned transparent photosensitive resin layer 51 are filled with black curable resin 53, which will act as a light absorbing layer (see FIG. 3E). A coating/filling method with a squeegee and/or coater is used for filling curable resin 53. The filling is preferably performed in vacuum (in a sufficiently evacuated vessel) in order to prevent poor filling with the curable material.

Black curable resin 53 is etched to expose the surface of transparent photosensitive resin layer 51 and then black curable resin 53 is cured. If black curable resin 53 does not adhere to the surface of transparent photosensitive resin layer 51 during the filling of black curable resin 53, the etching step can be omitted.

Finally, transparent substrate 54 is attached to transparent photosensitive resin layer 51 and black curable resin 53 to complete microlouver 60 (see FIG. 3E). Transparent substrate 54 may be attached onto transparent photosensitive resin layer 51 and black curable resin 53 by laminating or may be attached onto transparent photosensitive resin layer 51 and black curable resin 53 through use of a transparent adhesion layer.

Another method for manufacturing a microlouver according to the first embodiment will be described below with reference to FIGS. 4A to 4C.

Figure 4A:
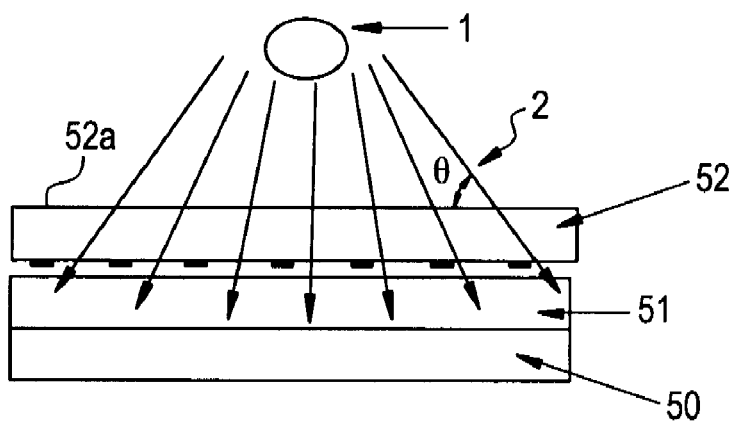
Figure 4B:
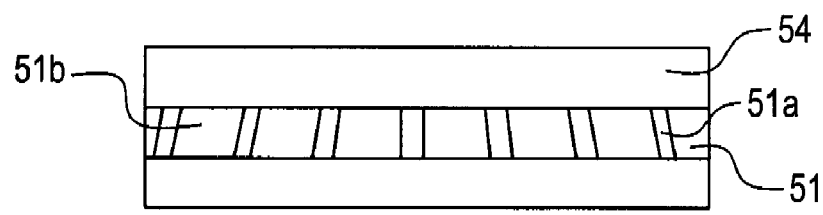

An exposure method similar to that used in the manufacturing method described above is used to pattern transparent photosensitive resin 51 (FIG. 4A). Then, transparent substrate 54 is attached onto patterned transparent photosensitive resin layer 51 (FIG. 4B). Transparent substrate 54 is adhered to transparent photosensitive resin layer 51 by hot pressing or UV pressing. If transparent substrate 54 does not firmly adhere to patterned transparent photosensitive resin layer 51 by adhesive bonding, an adhesion layer (which may be made of the same photosensitive resin as photosensitive resin 51) is provided between transparent substrate 54 and patterned transparent photosensitive resin layer 51 and then they are adhered together by hot pressing or UV pressing. In this way, transparent substrate 54 can be firmly adhered to patterned transparent resin layer 51.

Figure 4C:
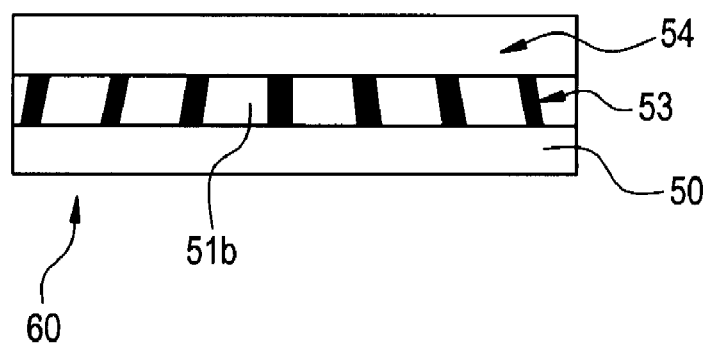

Then, black curable resin 53 is put into gaps in patterned transparent photosensitive resin layer 51 in the atmosphere or in a vacuum by using the capillary phenomenon (FIG. 4C). Then, black curable resin 53 is UV-cured or hot-cured to complete a microlouver in this manufacturing method.

The transparent substrate can be more firmly bonded curing black curable resin 53. Consequently, defects such as detachment of the transparent substrate can be prevented. In addition, curing of black curable resin 53 can prevent defects such as leakage of the black curable resin. Black curable resin 53 is preferably a solvent-free material. In the case of a solvent-type curable resin, the solvent evaporates after filling and volumetric shrinkage occurs in the filled layer, resulting in non-uniform light shielding characteristics in the regions filled with the black curable resin (light absorbing layer) throughout the substrate. As a result, display non-uniformity occurs.

As has been described, the optical element manufacturing methods in the first embodiment enables a slanted transparent layer and a light absorbing layer to be formed without performing the processes for curving transparent photosensitive resin layer 51 or flattening curved transparent photosensitive resin layer 51 under heat and pressure. Therefore, the density of transparent layer portions 51*b* of microlouver 60 is uniform both in the vicinity of transparent substrate 54 and in the vicinity of transparent substrate 50. Furthermore, because the substrate is not mechanically transformed or heated or pressed in order to form the slanted transparent layer portions and light absorbing layer portions during the manufacturing process, reduction in yields due to damage can be prevented. According to the present invention, the transparent layer portions and light absorbing layer portions are formed without mechanically transforming members under heat and pressure. Therefore, interface surface 80 between the transparent layer and light absorbing layer 80 is not curved but is flat. It should be noted that interface surfaces 80 are flat but are not parallel with each other because they are formed by using scattering light.

Figure 5:
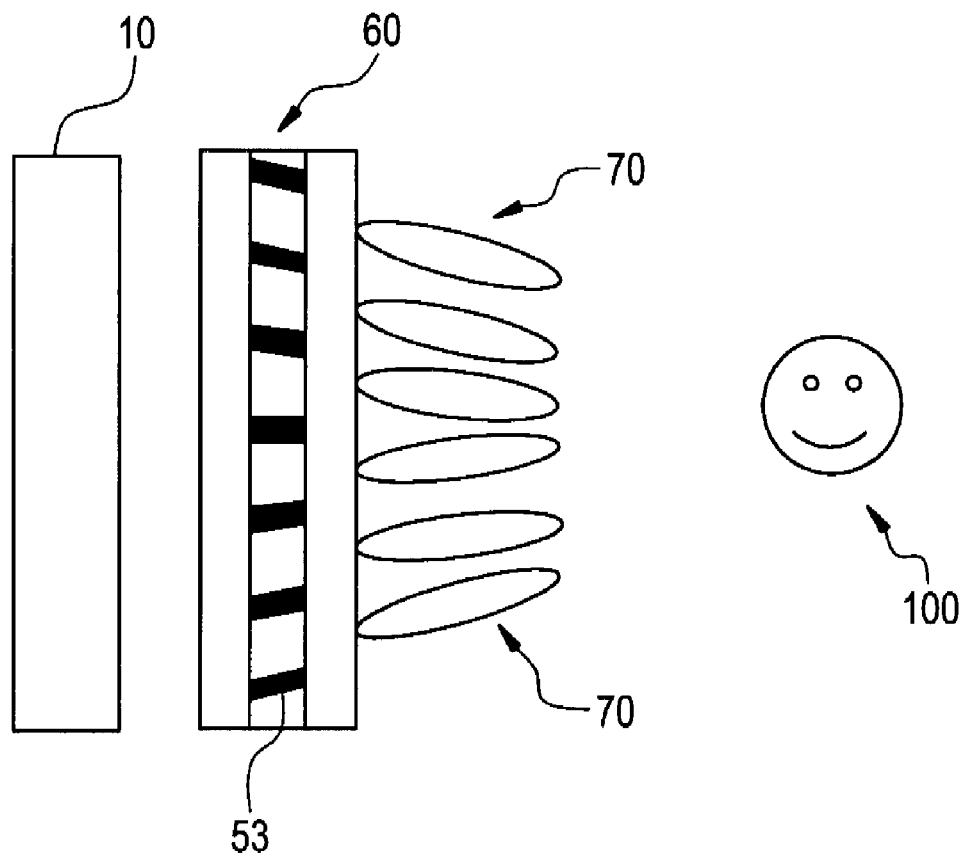
FIG. 5 is a conceptual diagram showing the light distribution characteristics of light transmitted from a backlight when a microlouver manufactured by the manufacturing method according to the first embodiment of the present invention is used.

FIG. 5 shows a conceptual diagram of light distribution characteristics of light transmitted from a backlight when microlouver 60 manufactured by a manufacturing method according to the embodiment is used.

Microlouver 60 is located in front of backlight 10. Microlouver 60 is positioned in such a manner that the converging side of black curable resin 53 faces viewer 100. Light 70 emitted from backlight 10 and transmitted through microlouver 60 converges at viewer 100. If microlouver 60 of the embodiment is applied to a large display, viewer 100 can clearly view an image in regions near the edges of the display as well as near the center region of the display.

Figure 1:
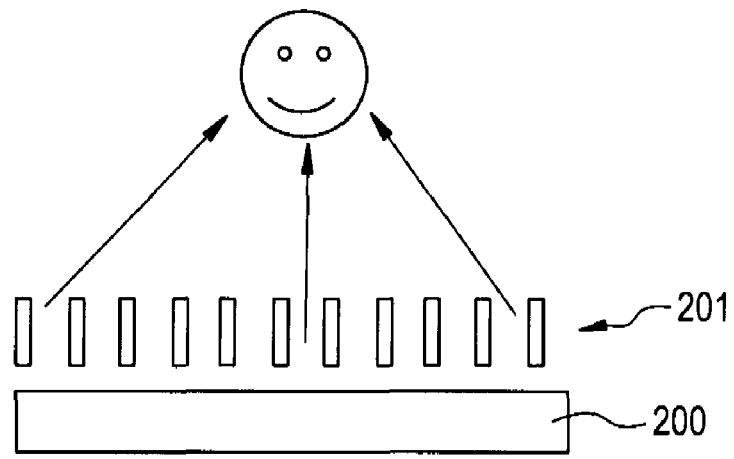
FIG. 1 is a schematic diagram showing an example of a microlouver used in a large-display of the related art.
Figure 6:
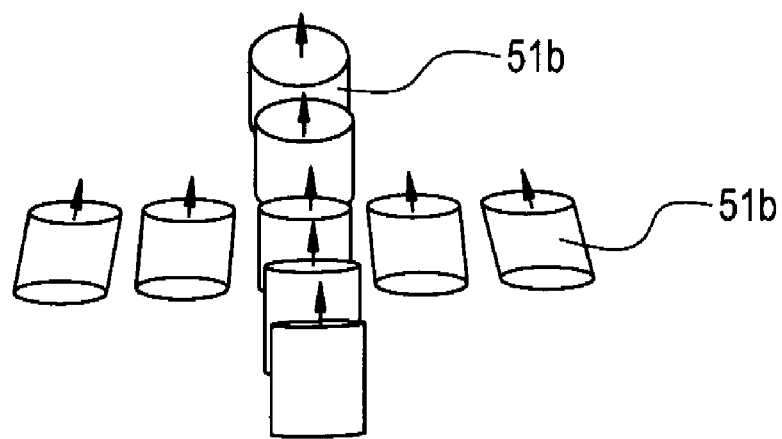
FIG. 6 is a conceptual diagram showing light distribution characteristics obtained using a two-dimensionally slanted transparent layer.

While pattern 51*a* in FIG. 1 is one-dimensionally slanted, two-dimensionally slanted transparent layer portions 51*b* are formed in transparent photosensitive resin layer 51 shown in FIG. 6 because point light source 1 is used for exposure. If transparent layer portions 51*b* are to be formed one-dimensionally slanted, a line light source elongated along the direction perpendicular to the sheet of FIG. 3C may be used in place of point light source 1 shown in FIG. 3C.

While point light source 1 is located above the center of mask 52 in the example of the embodiment in order to apply scattering light 2 from the center of mask 52 toward the regions near the edges of mask 52, the present invention is not so limited. The light source may be located at a position to which light from the display is to be converged and scattering light is emitted from the position to the mask. Thus, a microlouver that converges light to a desired position can be provided.

According to the present invention, a collimated light source may be provided in place of the light source that emits scattering light to the position to which the light is to be converged, and the light source may be rotated during exposure to apply the exposure light to the mask at angles.

Second Embodiment

Figure 7A:
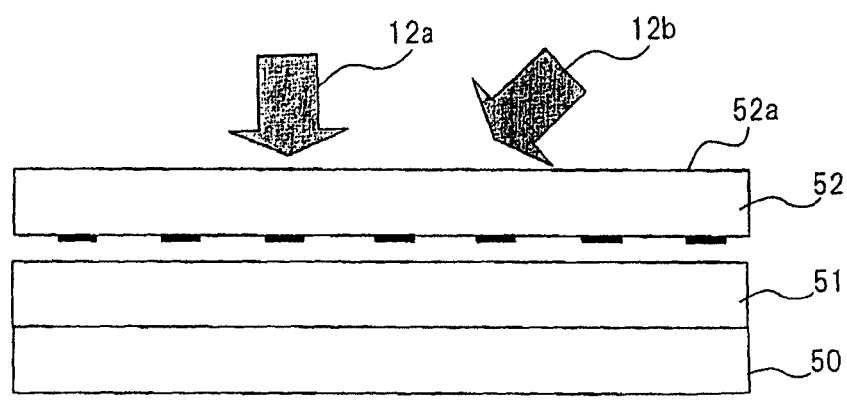
FIGS. 7A, 7B, and 7C are diagrams schematically showing the manufacturing process of a microlouver according to a second embodiment of the present invention.
Figure 7B:
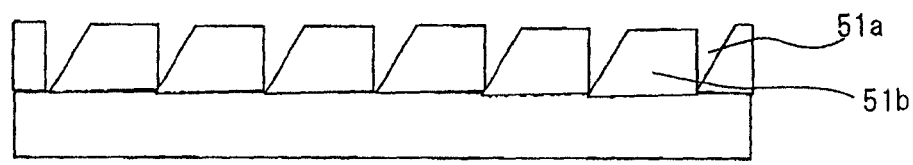
Figure 7C:
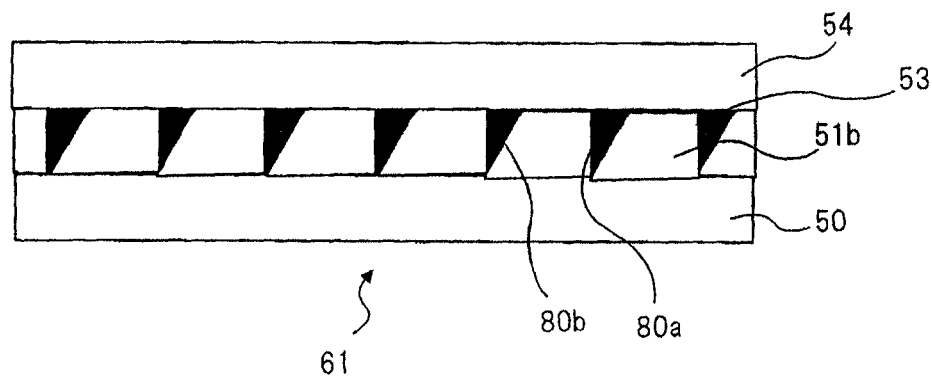

FIGS. 7A to 7C schematically show a process for manufacturing a microlouver according to a second embodiment. For simplicity, the same reference numerals as those used in the first embodiment will be used as reference numerals of elements such as a substrate in the following description.

In the second embodiment, parallel UV light 12a and 12b is emitted twice from a light source, not shown (see FIG. 7A). First, parallel UV light 12a is applied to mask 52 perpendicularly to mask 52. Then, parallel UV light 12b is applied to mask 52 at an angle. Both of the exposure light rays are UV light having a wavelength of 365 μm. The exposure light may be applied to mask surface 52a of mask 52 first at an angle and then perpendicularly to mask surface 52a.

By applying light twice in this way, trenches each having a triangular profile narrowing toward transparent substrate 50, one side of which is perpendicular to transparent substrate 50 and the other side of which is slanted, are formed between transparent layer portions 51b as shown in FIG. 7B. Transparent layer portions 51b are formed into a trapezoidal shape, one side of which is slanted and the other side of which is vertical.

Then, the gaps between the transparent layer portions of patterned transparent photosensitive resin layer 51 are filled with black curable resin 53. After black curable resin 53 is cured, finally transparent substrate 54 is attached onto transparent photosensitive resin layer 51 and black curable resin 53 to complete microlouver 61 (see FIG. 7C). Black curable resin 53 that is put into the triangular gaps by exposure becomes a light absorbing layer with a triangular profile having side 53a perpendicular to transparent substrate 54 and slanted side 53b.

Transparent layer 51b becomes a trapezoidal shape. Interface surface 80a perpendicular to transparent substrate 54 and interface surface 80b slanted with respect to transparent substrate 54 are formed between black curable resin 53 and each transparent layer portion 51b. Interface surface 80a and interface surface 80b are not parallel with each other but interface surfaces 80a or interface surfaces 80b are parallel with each other.

Figure 8:
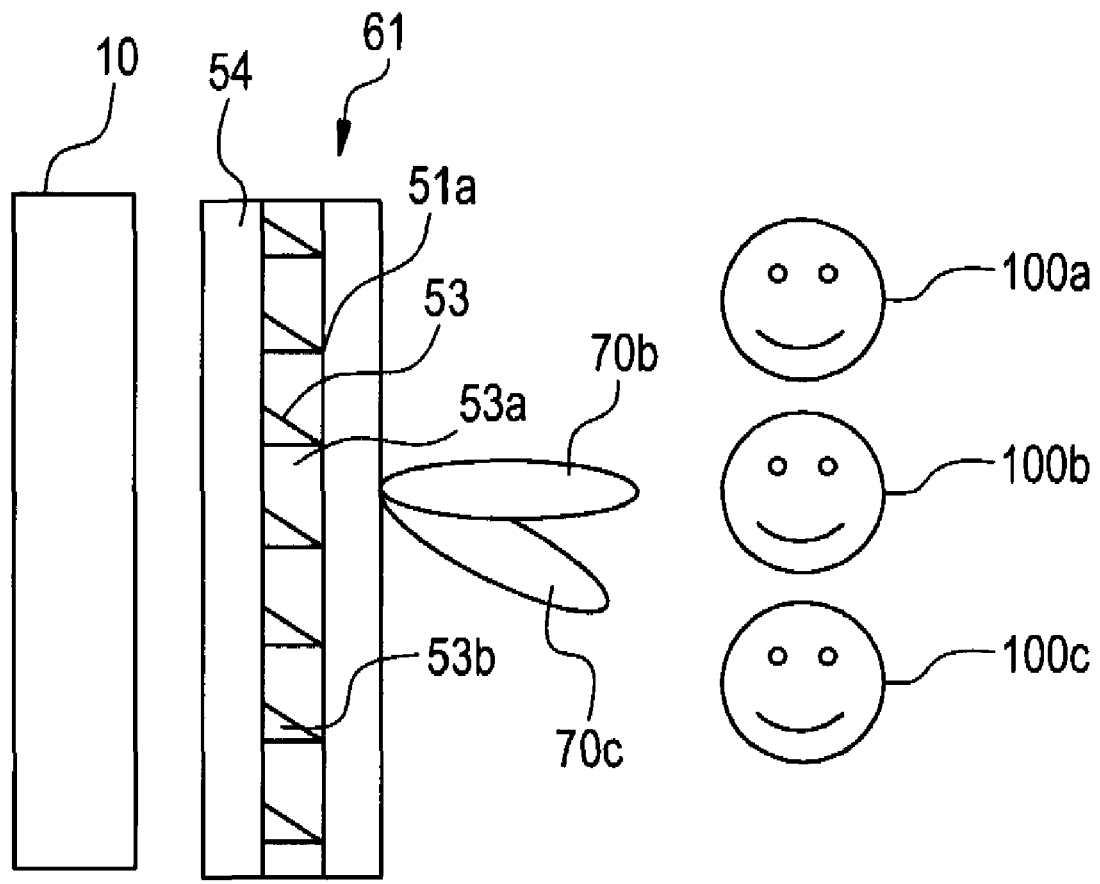
FIG. 8 is a conceptual diagram showing a light distribution characteristics of light transmitted from a backlight when a microlouver manufactured by the manufacturing method according to the second embodiment of the present invention is used.

FIG. 8 shows a conceptual diagram of light distribution characteristics of light transmitted from a backlight when microlouver 61 manufactured by the manufacturing method according to the second embodiment is used.

Microlouver 61 is positioned so that transparent substrate 54 faces backlight 10. That is, microlouver 61 is disposed between backlight 10 and viewers 100a to 100c so that the tip 51a' of triangular black curable resin 53 is directed toward viewers 100a to 100c. Light emitted from backlight 10 and transmitted through microlouver 61 is distributed as transmitted light rays 70b and 70c. Therefore, microlouver 61 allows viewer 100b located on the extension line of side 53a and viewer 100c located on the extension line of side 53b to view transmitted light 70b and 70c, respectively. However, viewer 100a located in another direction cannot view transmitted light 70b and 70c. In this way, parallel UV light of microlouver 61 applied twice has light distribution characteristics such that the light is directed toward positions directly in front of the center of the screen and in one predetermined direction.

Figure 9A:
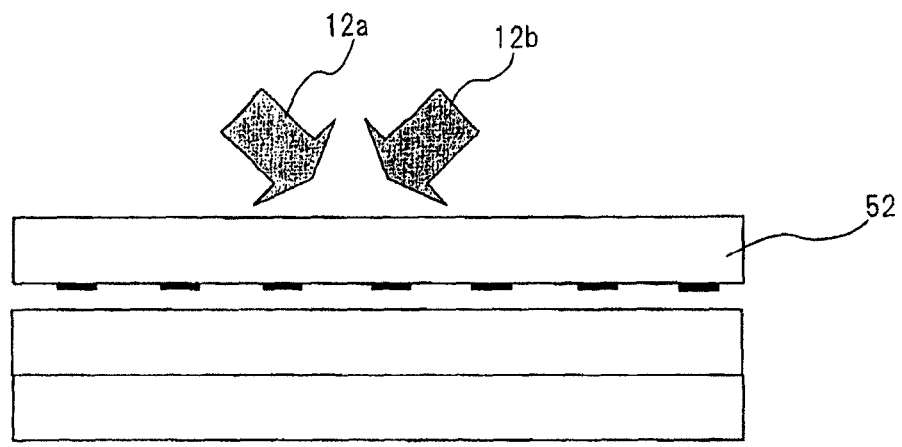
FIGS. 9A, 9B, and 9C are diagrams schematically showing another manufacturing process of a microlouver according to the second embodiment of the present invention.

Both of the parallel UV light rays applied twice may be applied to mask 52 at angles. That is, parallel UV light 12a may be applied from the left above mask 52 and parallel UV light 12b may be applied from the right above mask 52 as shown in FIG. 9A. As a result, the light absorbing layer made of black curable resin 53 is formed into a shape having slanted side 53a parallel with parallel UV light 12a and slanted side 53b parallel with parallel UV light 12b. Parallel UV light 12a and parallel UV light 12b may be applied axisymmetrically about the normal to mask 52 or at any different angles.

Figure 9B:
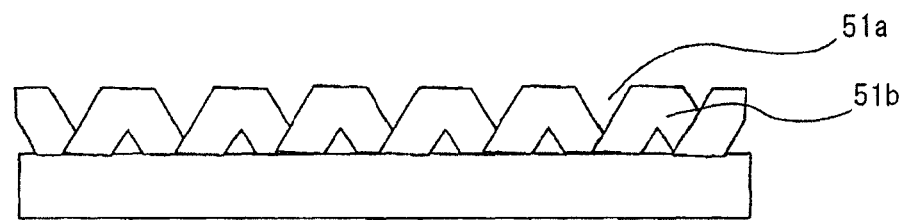

Gaps between transparent layer portions of patterned transparent photosensitive resin layer 51 are filled with black curable resin 53 as shown in FIG. 9B. Finally, after black curable resin 53 is cured, transparent substrate 54 is attached onto transparent photosensitive resin layer 51 and black curable resin 53 to complete a microlouver 62 (see FIG. 9C). Each of transparent layer portions 51b has an inverted-V-shape. Each of the light absorbing layer portions made of black curable resin 53 has a triangular profile. Interface surface 80a parallel with parallel UV light 12a and interface surface 80b parallel with parallel UV light 12b are formed between black curable resin 53 and each transparent layer portion 51b. Interface surface 80a and interface surface 80b are not parallel with each other but interface surfaces 80a or interface surfaces 80b are parallel with each other.

Figure 10:
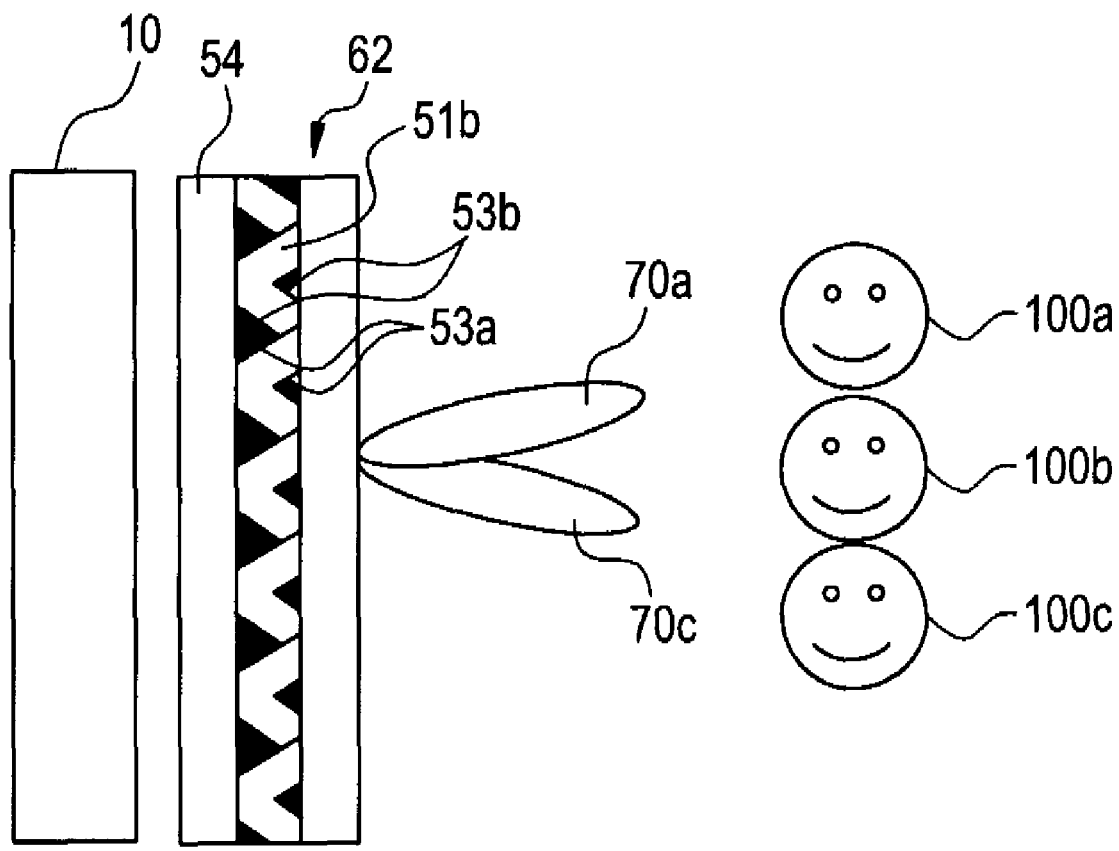
FIG. 10 is a conceptual diagram showing a light distribution characteristics of light transmitted from a backlight when another microlouver is manufactured by the manufacturing method according to the second embodiment of the present invention.

FIG. 10 shows a conceptual diagram of light distribution characteristics of light transmitted from a backlight when microlouver 62 manufactured by the manufacturing method of the second embodiment is used.

Microlouver 62 is positioned in such a manner that transparent substrate 54 faces backlight 10. That is, microlouver 62 is disposed between backlight 10 and viewers 100a to 100c in such a manner that the open side of the V-shape of transparent layer 51b is faced toward viewers 100a to 100c. Light emitted from backlight 10 and transmitted through microlouver 62 is distributed as transmitted light 70a and 70c. Therefore, viewer 100a located on the extension line of side 53a and viewer 100c located on the extension line of slanted side 53b can view transmitted light 70a and 70c, respectively. However, viewer 100a located in another direction, directly in front of backlight 10, cannot view transmitted line 70a and 70c. In this way, parallel UV light of microlouver 62 applied twice has light distribution characteristics such that the light is directed in predetermined directions other than toward positions directly in front of the center of the screen.

Figure 9C:
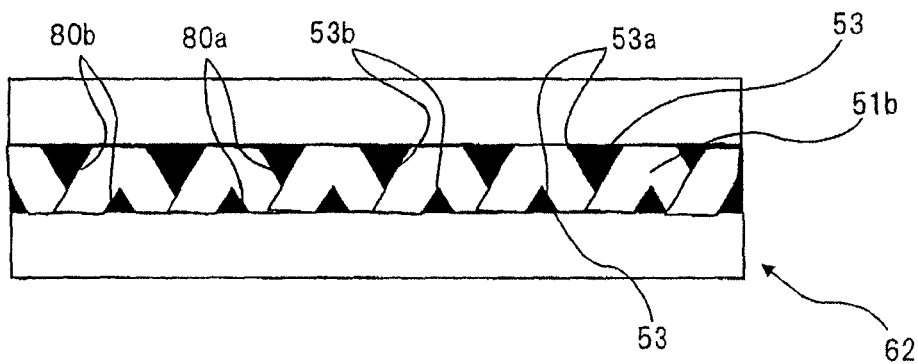
Figure 11:
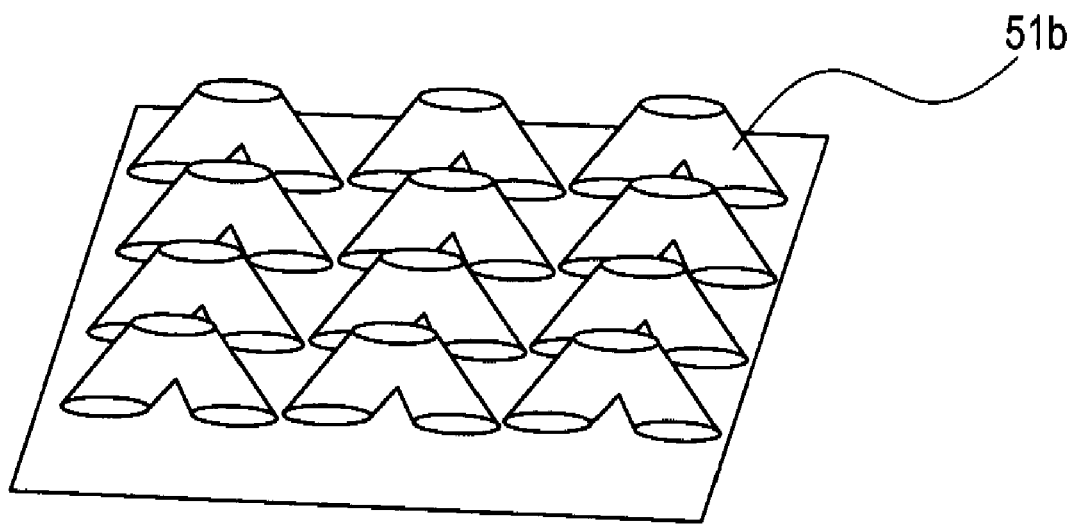
FIG. 11 is a schematic diagram showing an example of a two-dimensionally slanted transparent layer.

Microlouver 62 shown in FIG. 9C may have transparent layer 51b two-dimensionally formed as shown in FIG. 11. In this case, the viewing angles on the left, right, top, and bottom can be restricted.

Figure 12:
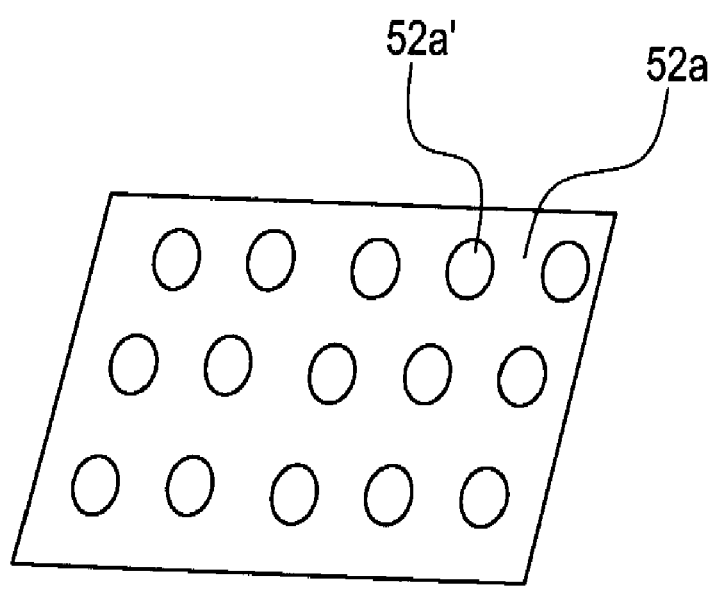
FIG. 12 is a diagram showing an example of a two-dimensional array mask for forming a two-dimensionally slanted transparent layer.

FIG. 12 shows an example of a two-dimensional array mask for forming transparent layer 51b having a two-dimensional shape as shown in FIG. 11. Multiple openings 52a' are formed in two-dimensional array mask 52a. Parallel UV light 12a and parallel UV light 12b are applied from two directions to openings 52a' to expose transparent photosensitive resin layer 51 to the light rays. As a result, transparent layer portions 51b as shown in FIG. 11 are left without exposure. Transparent layers 51b slanted toward the center of the screen as shown in FIG. 6 in the first embodiment can also be formed by combining two-dimensional array mask 52a shown in FIG. 12 and a point light source.

Third Embodiment

Figures 13A, 13B, 13C:
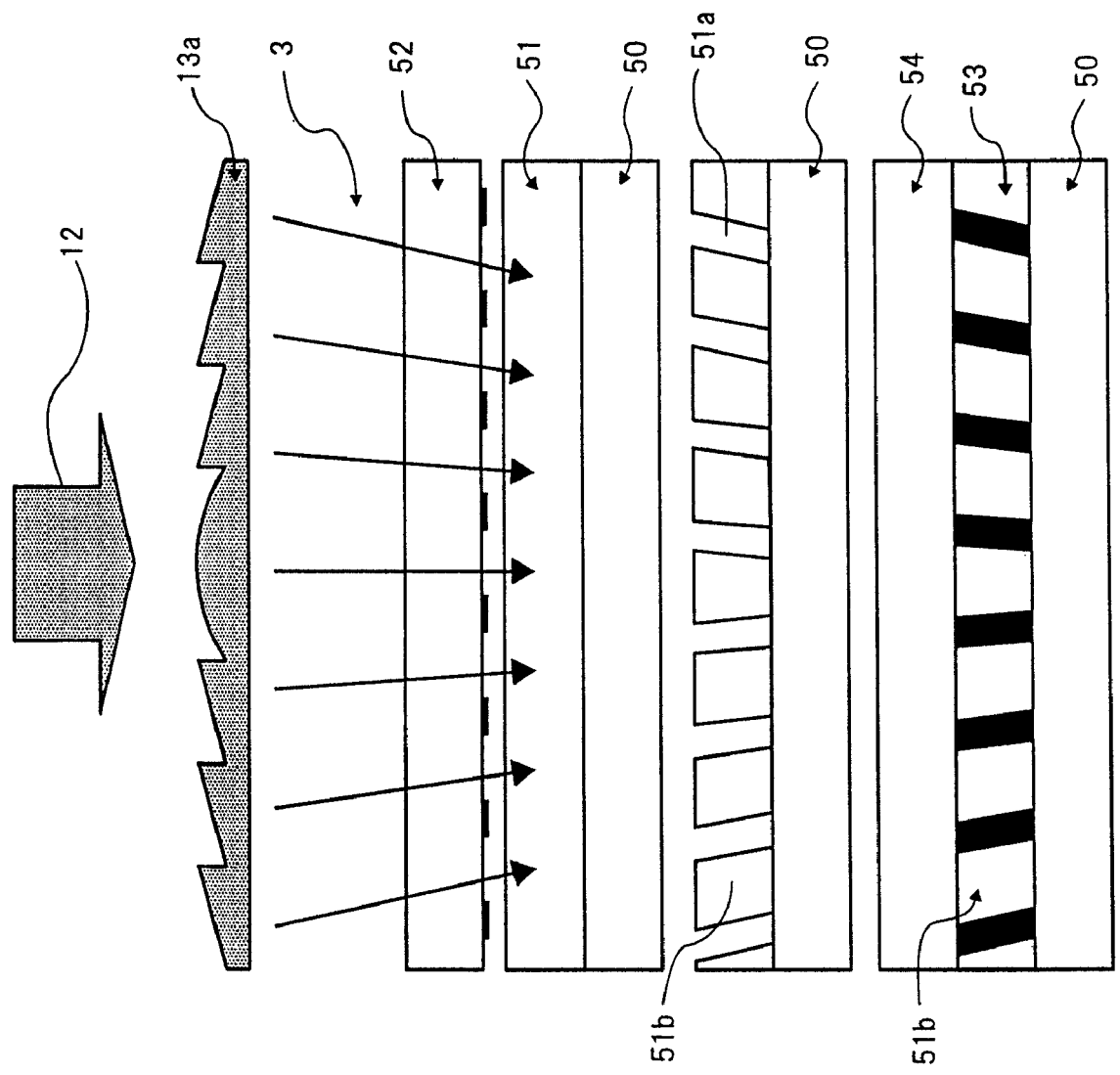
FIGS. 13A, 13B, and 13C are diagrams schematically showing the manufacturing process of a microlouver according to a third embodiment of the present invention.

FIGS. 13A to 13C schematically show a process for manufacturing a microlouver according to a third embodiment of the present invention. For simplicity, the same reference numerals as those used in the first embodiment will be used as reference numerals of elements such as a substrate in the following description.

First, parallel UV light 12 is applied to convex Fresnel lens 13a. Due to the effect of Fresnel lens 13a, the UV light converges, passes through mask 52, and illuminates transparent photosensitive resin 51 (se FIG. 13A). Mask 52 and transparent photosensitive resin 51 in this embodiment are disposed in front of the focal position of Fresnel lens 13a.

The angles of the slanted surfaces of transparent layer portions 51b are determined by the positional relation between the focal position of Fresnel lens 13a and transparent photosensitive resin 51. Therefore, the distance between Fresnel lens 13a and transparent photosensitive resin 51 during manufacturing is determined in accordance with the angle of the slanted surface required for applications for which the microlouver is used.

As a result of the exposure described above, a pattern which is a vertical flip of the pattern shown in FIG. 3D in the first embodiment is formed as shown in FIG. 13B. That is, transparent layers 51b slanted so as to converge toward transparent substrate 50 are formed.

After the gaps are filled with black curable resin 53 using a method similar to that in the first embodiment, transparent substrate 54 is laminated on transparent photosensitive resin layer 51 and black curable resin 53 (see FIG. 13C). As a result of these steps, a microlouver as shown in FIG. 13C is provided. As mentioned above, the structure of the microlouver is a vertical flip of that of the microlouver given in the first embodiment. Therefore, when the microlouver is used in a in a specific mode, which will be described later, the microlouver is vertically flipped. While the filling method described with respect to the first embodiment is used to form black curable resin 53 in the third embodiment, the method is not limited to this. Black curable resin 53 may be put in the gaps by using the capillary phenomenon after transparent substrate 54 is adhered onto transparent photosensitive resin 51, as shown in FIGS. 4B and 4C.

Figures 14A, 14B, 14C:
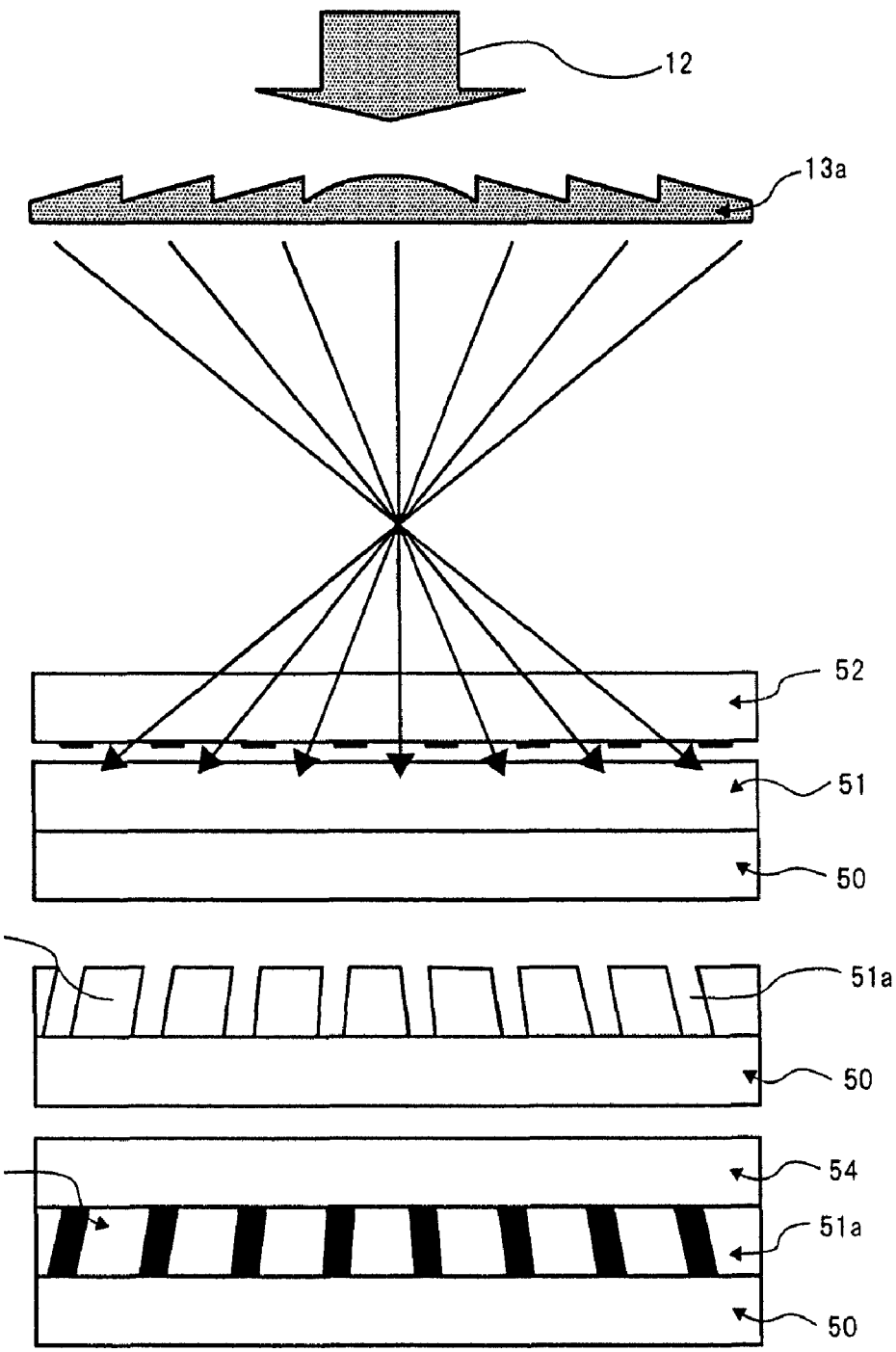
FIGS. 14A, 14B, and 14C are diagrams schematically showing another manufacturing process of a microlouver according to the third embodiment of the present invention.

Another method for manufacturing a microlouver according to the third embodiment will be described with reference to FIGS. 14A to 14C.

This manufacturing method differs from the manufacturing method described above in that mask 52 and transparent photosensitive resin 51 are disposed in positions father from the focal position of Fresnel lens 13a. By disposing them at such positions and exposing transparent photosensitive resin 51 to form a pattern, slanted transparent layer portions 51b can be formed as in the first embodiment. The subsequent steps are the same as those in the manufacturing method described above. As a result the microlouver shown in FIG. 14C is provided.

Figures 15A, 15B, 15C:
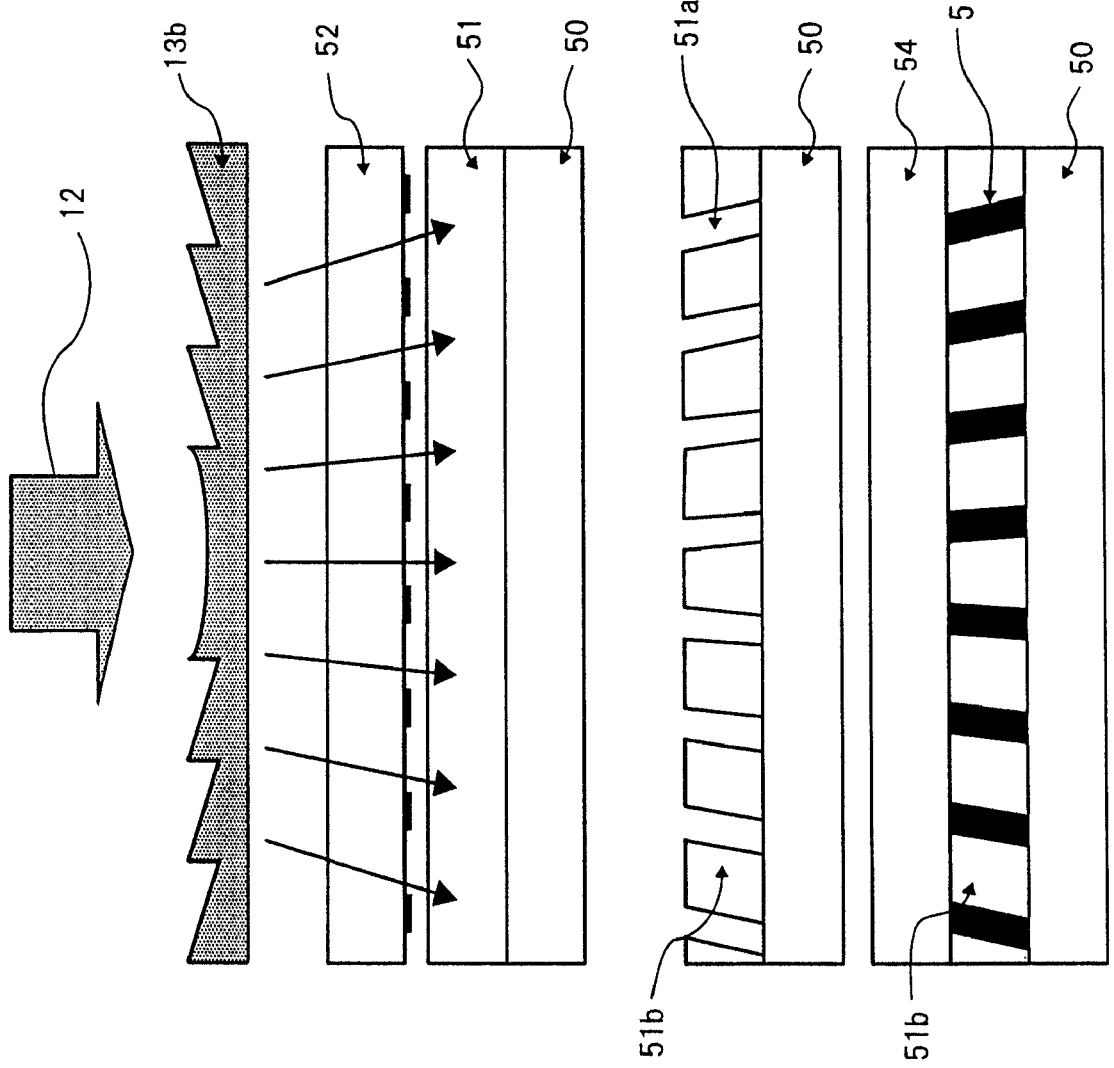
FIGS. 15A, 15B, and 15C are diagrams schematically showing yet another manufacturing process of a microlouver according to the third embodiment of the present invention.

Another method for manufacturing a microlouver according to the third embodiment will be described with reference to FIGS. 15A to 15C.

The manufacturing method differs from the manufacturing method described above in that concave Fresnel lens 13b is used. After passing through Fresnel lens 13b, parallel UV light 12 scatters and passes through mask 52 to illuminate transparent photosensitive resin 51 (see FIG. 15A).

The angles of the slanted surfaces of transparent layer portions 51b are determined by the positional relation ship between the distance between Fresnel lens 13b and transparent photosensitive resin 51 and the focal position of Fresnel lens.

As a result of the exposure described above, slanted transparent layer portions 51b similar to those formed in the first embodiment in FIG. 3D are formed.

The subsequent steps are the same as those in the manufacturing method described above. As a result, the microlouver shown in FIG. 15C is provided.

While the manufacturing methods in the embodiment described above use Fresnel lens, the embodiment is not so limited. For example, a convex or concave lens may be used.

Thus far, methods for forming a single microlouver on a transparent substrate have been described. A method for forming multiple microlouvers on a single transparent substrate will be described next.

Figure 16A:
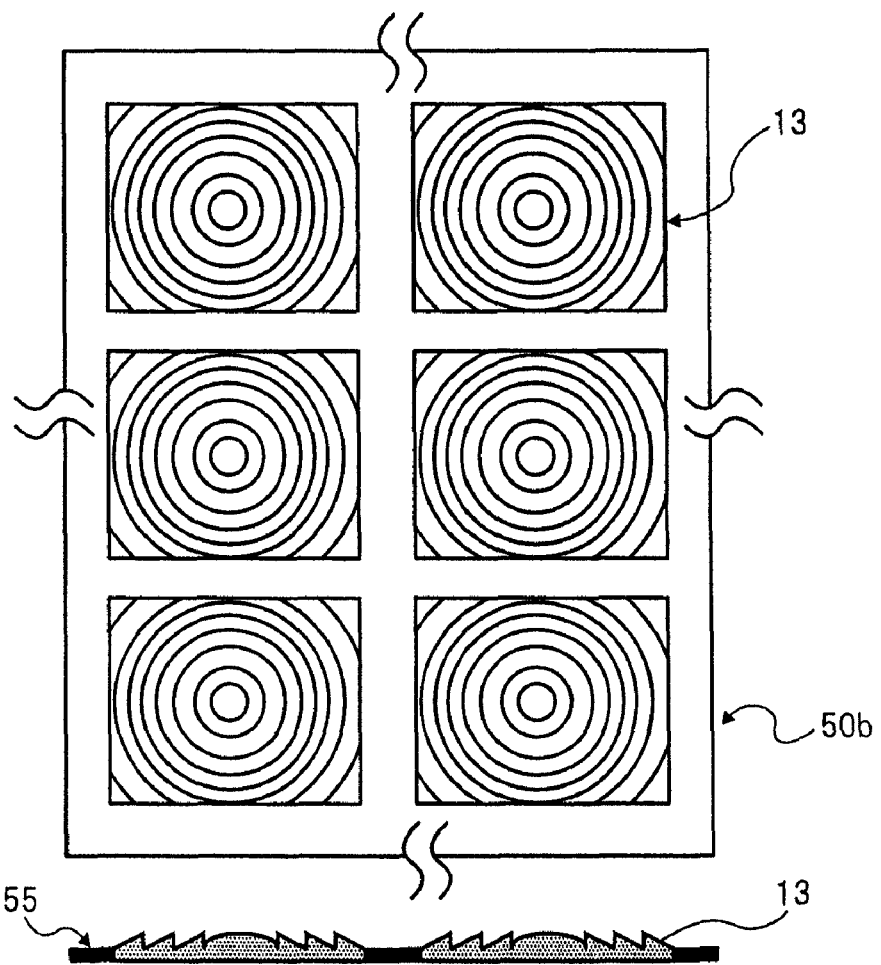
FIGS. 16A and 16B show an arrangement of a mask and lenses in a multiple microlouver production step of the manufacturing process of the microlouver according to the third embodiment of the present invention.
Figure 16B:
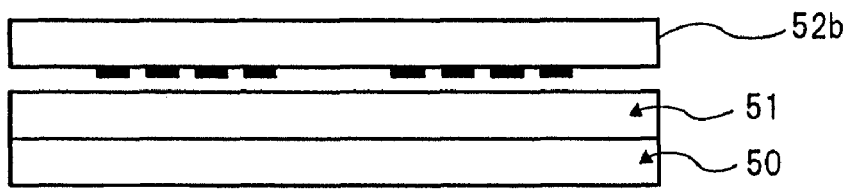

First, mask 52b and multiple Fresnel lenses 13 are disposed on a flat surface of transparent substrate 50 in this order as shown in FIG. 16A. Adjacent Fresnel lenses are light-shielded from each other as shown in the cross-sectional view in FIG. 16B. Entire transparent photosensitive resin 51 is patterned by illuminating it with parallel UV light at one time. Then, black curable resin 53 filling is performed in the same way as described above.

According to the method described above, multiple microlouvers can be formed on a single transparent substrate.

By shielding adjacent Fresnel lenses from each other, transparent photosensitive resin 51 is removed after patterning. Accordingly, multiple microlouvers formed can be easily separated from each other.

While multiple identical Fresnel lenses are formed in this embodiment shown in FIG. 16A, the present invention is not so limited. For example, Fresnel lenses of different sizes, Fresnel lenses having different focal positions, and Fresnel lenses with different seizes and different focal positions may be combined and used for exposure. The distance from multiple microlouver production mask 52b to individual Fresnel lenses may be varied. Thus, microlouvers having different sizes and different slant angles can be formed on the same transparent substrate at same time.

While the foregoing description has been given with respect to axisymmetric Fresnel lenses, the present invention is not limited to axisymmetric Fresnel lenses. Linear Fresnel lenses can be used to provide the same effect.

Microlouvers of the present invention described above can be applied not only to liquid-crystal displays but also other display apparatuses having a display panel, for example plasma displays.

The microlouver of the present invention may be used in various modes. The microlouver may be built into an illuminating optical apparatus illuminating a display panel, or may be directly adhered to the surface of a display panel, or provided inside a display apparatus. Configurations of these modes of use will be described below. Modes of use of microlouver 60 described in the first embodiment will be described by way of example.

First, a mode will be described in which the microlouver of the present invention is directly adhered onto the surface of a display panel.

Figure 17:
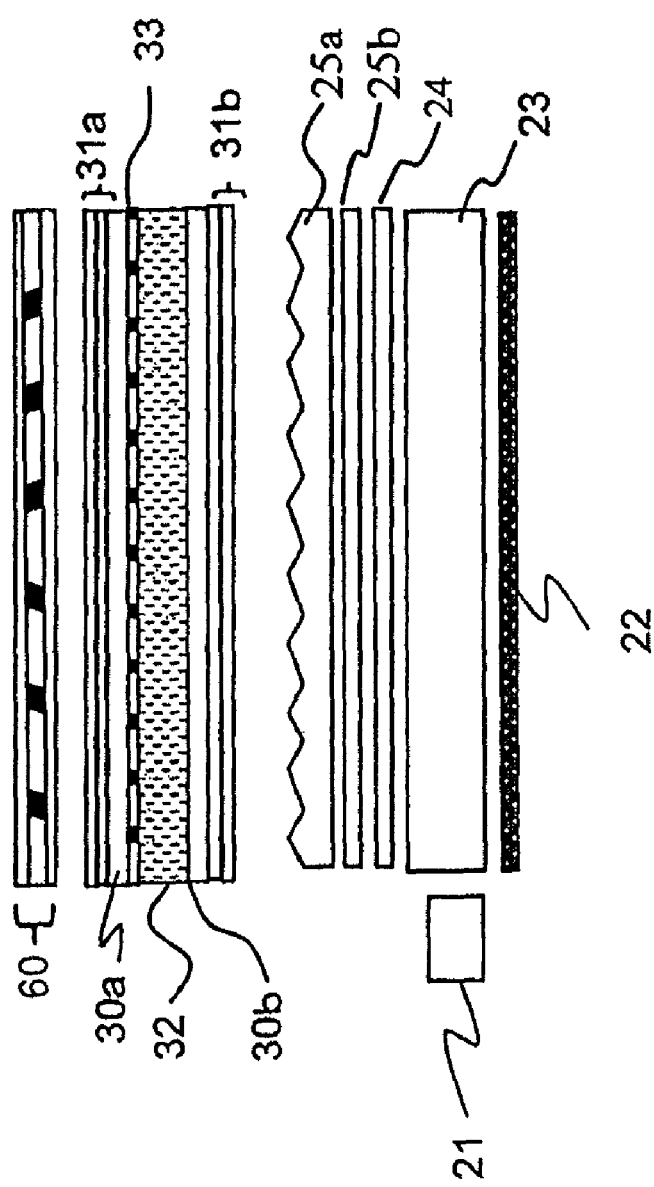
FIG. 17 is a cross-sectional view showing the structure of a display apparatus in which a microlouver of the present invention is provided on a display screen.

FIG. 17 shows a structure of a display apparatus in which a microlouver of the present invention is provided on a display screen. Referring to FIG. 17, the display apparatus includes an optical control element, an illuminating optical apparatus, and microlouver 60.

As has been described in the first embodiment, microlouver 60 has light distribution characteristics in which light (internal light) from an optical control element converges to the center of the screen. The illuminating optical apparatus includes light source 21 such as a cold-cathode tube, reflection sheet 22, optical waveguide 23, diffusion plate 24, and prism sheets 25a and 25b, and illuminates the optical control element with light transmitted through prism sheets 25a and 25b. Light source 21 is a sheet light source.

Optical waveguide 23 is made of a material such as acrylic resin. Light from light source 21 enters the one end surface and incident light travels through the optical waveguide and is uniformly emitted through a right side (predetermined side). Provided on the back side of optical waveguide 23 is reflection sheet 22 which reflects light emitted through the back side toward the right side. Although not shown, reflecting means is also provided on the other end surface and side surface of optical waveguide 23.

Light emitted from the right side of optical waveguide 23 enters the optical control element through diffusion plate 24 and prism sheets 25a and 25b. Diffusion plate 24 is used for diffusing light entering from optical wave guide 23. There is a difference in brightness between light rays emitted from the right and left ends of optical waveguide 23 because of the structure of optical waveguide 23. Therefore, diffusion plate 24 is used to diffuse light from optical waveguide 23.

Prism sheets 25a and 25b increase the brightness of light entering from optical waveguide 23 through diffusion plate 24. Prism sheet 25a includes multiple prisms arranged at predetermined intervals in a predetermined direction. Prism sheet 25b has the same configuration as that of prism sheet 25a except that the regular arrangement of the prisms crosses the direction of the regular arrangement of the prisms of prism sheet 25a. Prism sheets 25a and 25b can increase the directivity of light diffused by diffusion plate 24.

While the present embodiment has been described with respect to a cold-cathode tube used as the light source, the light source is not limited to this. The light source may be a white LED or tricolor LED. While the light source in the present embodiment is a sidelight-type light source, the light source is not limited to this. The light source may be a direct light source.

The optical control element has a structure in which liquid-crystal layer 32 is sandwiched between two substrates 30a and 30b. A color filter 33 is formed on one side (on the liquid-crystal layer 32 side) of substrate 30a, and polarizer and retarder 31a is provided on the other side. Polarizer and retarder 31b is provided on the surface of substrate 30b on the side opposite from the liquid-crystal layer 32 side. Color filter 33 has an area partitioned by a black matrix which is a light absorbing layer. R (red), G (green), and B (blue) color filters are arranged in a matrix in the area. Each color filter corresponds to a pixel and the pixels are arranged at a regular pitch. Liquid-crystal layer 32 is capable of switching between a transparent state and a light-shielding state on a pixel-by-pixel basis in accordance with a control signal from a controller, not shown. Incident light is spatially modulated by the switching.

In the display apparatus shown in FIG. 17, light passing through prism sheets 25a and 25b enters polarizer and retarder 31b. After passing through polarizer and retarder 31b, the light enters liquid-crystal layer 32 through substrate 30b, where spatial modulation is applied to each pixel. The light (modulated light) that has passed through liquid-crystal layer 32 travels through color filter 33 and substrate 30a and enters polarizer and retarder 31a. Light that has passed through polarizer and retarder 31a is emitted through microlouver 60. While pairs of polarizer and retarder 31a and 31b are used as optical control elements in FIG. 17, the optical control elements may include only a polarizer.

In the display apparatus described above, microlouver 60 converges light (modulated light) from polarizer and retarder 31a toward the center of the screen. This allows a viewer to clearly view an image on the screen even in regions near the edges of the screen. A hard coat layer which protects the display from scratches and an anti-reflection layer which prevents reflection of outside light may be formed on the surface of microlouver 60.

Microlouver 60 may be a detachable one. In this case, microlouver 60 can be attached to an optical control element to provide light distribution characteristics that converges light toward the center of the screen, and can be removed to provide light distribution characteristic that diffuse light throughout the entire screen.

A display apparatus including a microlouver of the present invention therein will be described below.

Figure 18:
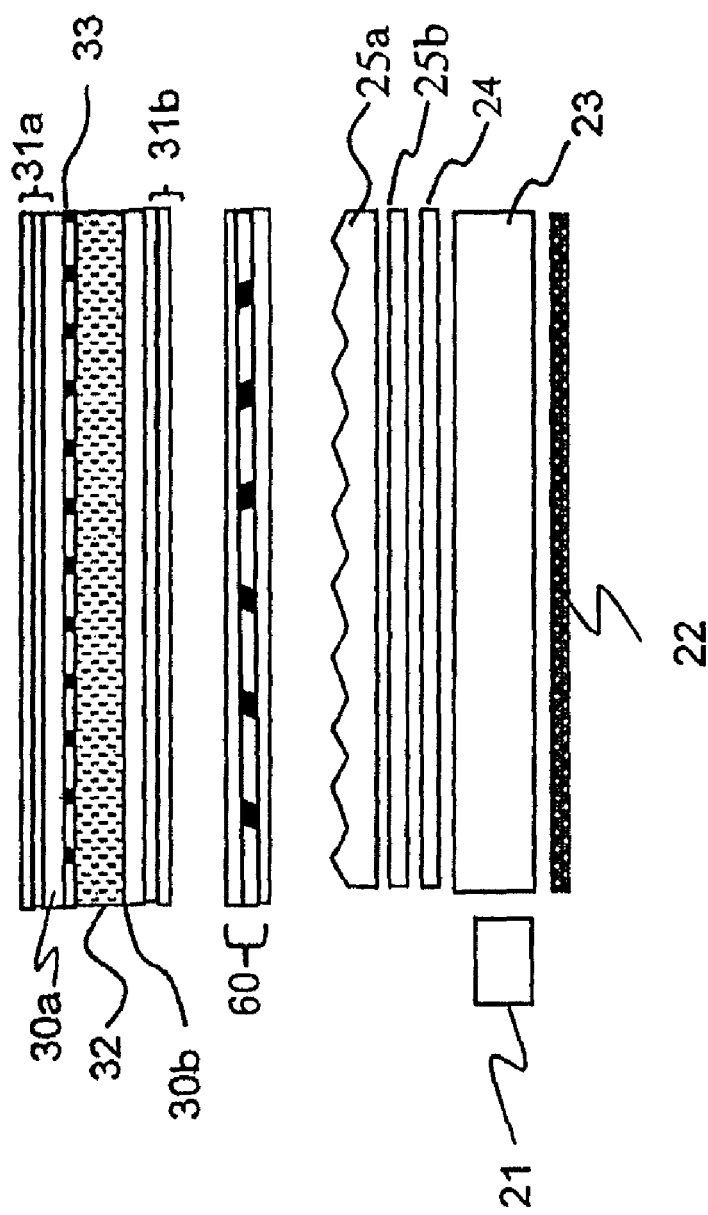
FIG. 18 is a cross-sectional view showing a display apparatus having a microlouver of the present invention provided therein.

FIG. 18 shows a configuration of a display apparatus including a microlouver of the present invention therein. A first display apparatus includes an optical control element, an illuminating optical apparatus which illuminates the optical control element, and microlouver 60 provided between the optical control element and the illuminating optical apparatus.

Figure 2:
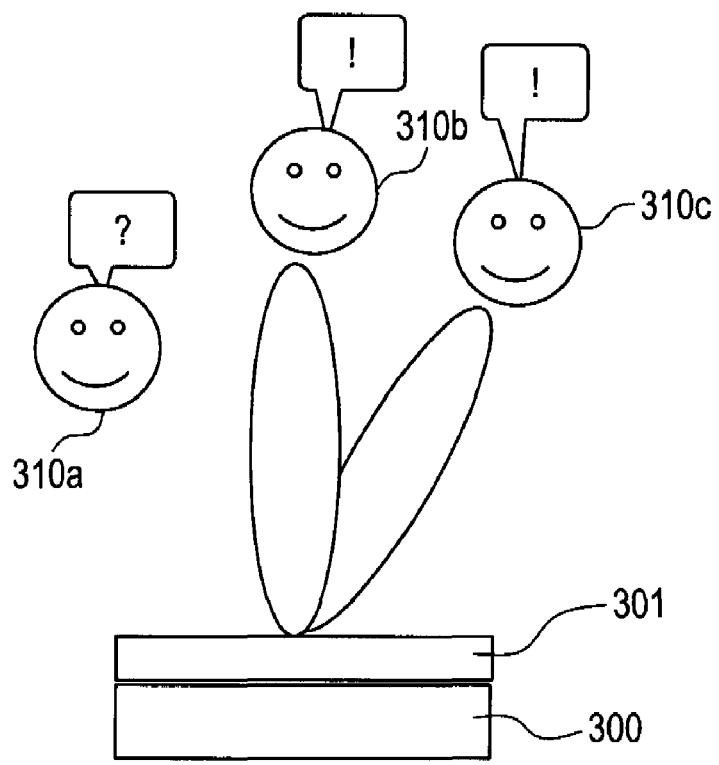
FIG. 2 is a schematic diagram showing an in-vehicle display, which is an example of displays that require customized light distribution characteristics.

Microlouver 60 has light distribution characteristics that converge light from the optical control element (internal light) toward the center of the screen, as has been described with respect to the first embodiment. The illuminating optical apparatus includes light source 21, reflection sheet 22, optical waveguide 23, diffusion plate 24, and prism sheets 25a and 25b as shown in FIG. 18. Light that passed through prism sheets 25a and 25b illuminates the optical control element through microlouver 60. The optical control element is the same as that shown in FIG. 2.

In the display apparatus described above, microlouver 60 converges light for illuminating the optical control element toward the center of the screen. This can ensure good visibility of an image even in regions near the edges of the screen to a viewer who is directly in front of the center of the screen.

In the configuration shown in FIG. 18, microlouver 60 may be bonded to polarizer and retarder 31b, which is an optical control element, through use of a transparent adhesion layer. With this configuration, the surface reflection loss at the interface between microlouver 60 and polarizer and retarder 31b can be reduced and brighter illumination light can be provided.

Figure 19:
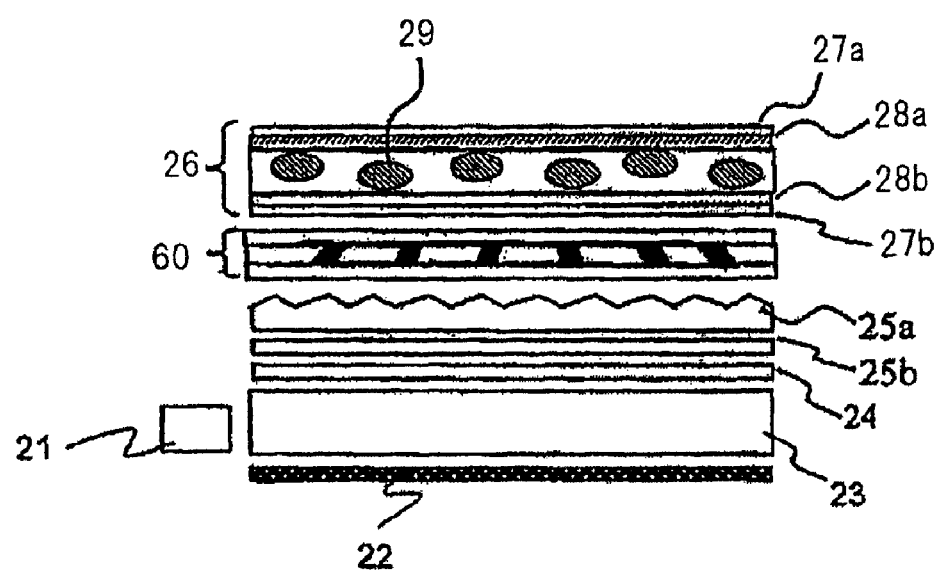
FIG. 19 is a cross-sectional view showing the structure of an illuminating optical apparatus including a transmission-diffusion switching element.

FIG. 19 shows a configuration of an illuminating optical apparatus including a microlouver of the present invention therein. A transmission-diffusion switching element is disposed on the illumination optical device containing the microlouver.

Transmission-diffusion switching element 26, which may be a PNLC (Polymer Network LC), includes substrate 27a on which transparent electrode 28a is provided, substrate 27b on which transparent electrode 28b is provided, and liquid crystal 29 and a polymer chain sandwiched between substrates 27a and 27b.

When a voltage is applied between transparent electrodes 28a and 28b, the refractive index of the polymer chain becomes identical to the refractive index of liquid crystal 29, and transmission-diffusion switching element 26 is placed in a transparent state. In the transparent state, light from microlouver 60 directly passes through transmission-diffusion switching element 26. On the other hand, when no voltage is applied between transparent electrodes 28a and 28b, the refractive index does not match that of liquid crystal 29 and light from microlouver 60 diffuses as it passes through transmission-diffusion switching element 26. In this way, transmission-diffusion switching element 26 is placed in the transparent state when a voltage is applied and is placed in the diffusion state when no voltage is applied.

In the illuminating optical apparatus shown in FIG. 19, when transmission-diffusion switching element 26 is placed in the transparent state, a light distribution characteristic that converges light toward the center of the screen can be provided. In the diffusion state, on the other hand, light emitted from microlouver 60 is diffused and the emission angle of light is widened accordingly. By switching transmission-diffusion switching element 26 between the transmission state and the diffusion state in this way, the angle of light emission of the illuminating optical apparatus can be changed.

Transmission-diffusion switching element 26 may be bonded to microlouver 60 through use of a transparent adhesion layer. According to this configuration, the surface reflection loss at the interface between microlouver 60 and transmission-diffusion switching element 26 can be reduced and brighter illumination light can be provided.

Figure 20:
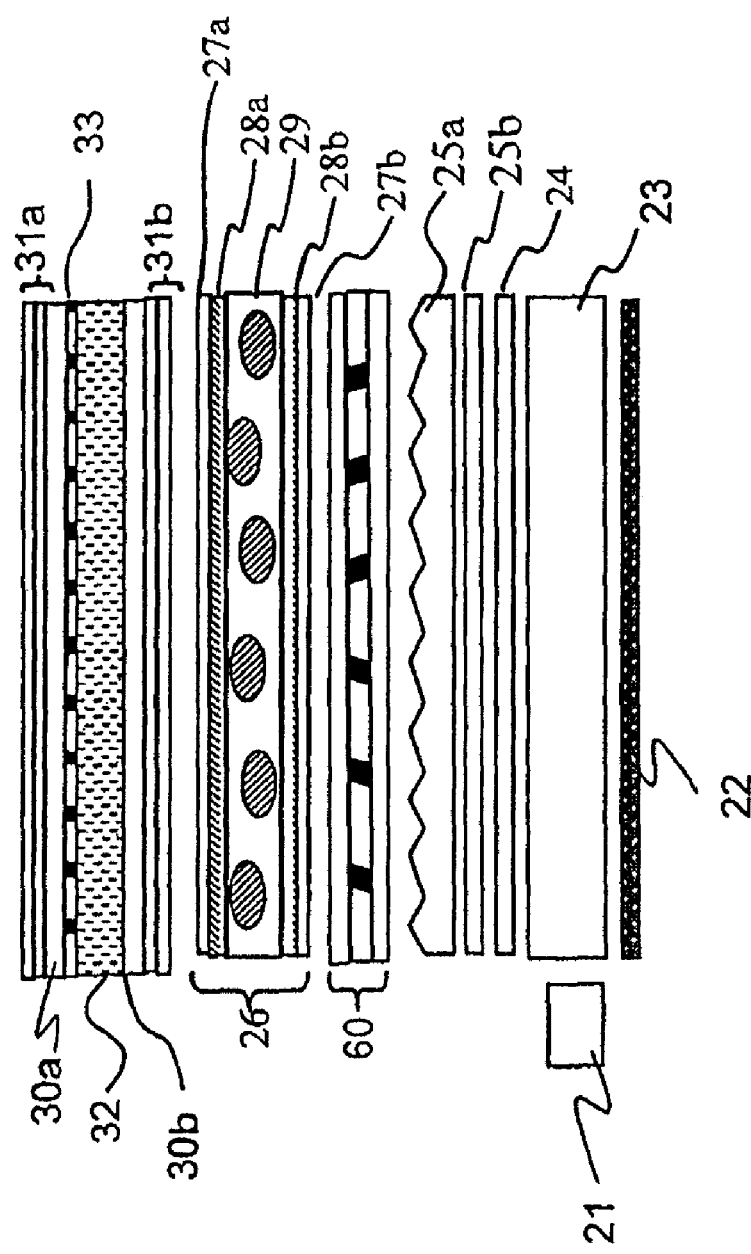
FIG. 20 is a cross-sectional view showing the structure of a display including a transmission-diffusion switching element and having a microlouver of the present invention therein.

FIG. 20 shows a configuration of another display apparatus including microlouver 60 of the present invention therein.

The display apparatus includes an optical control element, an illuminating optical apparatus which illuminates the optical control element, and microlouver 60 and transmission-diffusion switching element 26 that are provided between the optical control element and the illuminating optical apparatus.

Microlouver 60 has light distribution characteristics that converge light from the optical control element (internal light) toward the center of the screen, as has been described with respect to the first embodiment. The illuminating optical apparatus includes light source 21, reflection sheet 22, optical waveguide 23, diffusion plate 24, and prism sheets 25a and 25b. Light that passed through prism sheets 25a and 25b illuminates the optical control element through microlouver 60. The optical control element is the same as that shown in FIG. 17. Transmission-diffusion switching element 26 is the same as that shown in FIG. 19.

In the display apparatus shown in FIG. 20, when transmission-diffusion switching element 26 is placed in a transparent state, light distribution characteristics can be provided that converge light toward the center of the screen. On the other hand, when transmission-diffusion switching element 26 is in a diffusion state, light emitted from microlouver 60 is diffused and therefore the angle of emission at the display panel is increased. In this state, the viewing angle is widened by the scattering of light and therefore the display screen is visible to multiple viewers at a time.

A transparent adhesion layer may be provided at the interface between microlouver 60 and substrate 27b of transmission-diffusion switching element 26 and/or at the interface between polarizer and retarder 31b, which is the optical control element, and substrate 27a of transmission-diffusion switching element 26 in order to have them adhere to each other. According to this configuration, the surface reflection loss at the interface between microlouver 60 and substrate 27b and/or the interface between polarizer and retarder 31b and substrate 27a can be reduced and brighter illumination light can be provided.

An input device may be added to the display apparatus described above. The input device may be a so-called touch panel which has a counter electrode consisting of an upper transparent electrode and lower transparent electrode and into which information about a position on the display panel based on a change in local pressure or resistance on the upper transparent electrode is input. The touch panel is not limited to a resistive touch panel. It may be a capacitive touch panel.

An example of applying of the present invention to a mobile information processing terminal such as mobile phones, laptop personal computers, and PDAs is the display apparatuses described above. A controller in an information processing apparatus receives input from input device such as a mouse and keyboard and controls the display apparatus to display the required information on the display apparatus.

What is claimed is:

1. An optical element manufacturing method comprising:
   disposing a mask on a transparent photosensitive resin;
   patterning said transparent resin by applying an exposure light to said transparent photosensitive resin through said mask to form a transparent layer;
   forming a light absorbing layer by filling a gap in said transparent layer with a black curable resin; and
   illuminating a mask surface of said mask with said exposure light at an angle that is inclined to the mask surface;
   wherein said transparent layer and said light absorbing layer are arranged alternately in a plane and the range of light transmitted through said transparent layer in the direction of the emission of light is restricted by said light absorbing layer.

2. The optical element manufacturing method according to claim 1, wherein said exposure light is scattering light.

3. The optical element manufacturing method according to claim 2, wherein said exposure light is emitted from a point light source.

4. The optical element manufacturing method according to claim 1, wherein said exposure light is collimated light; and
   a lens is provided above the mask surface of said mask and said transparent layer is patterned by illuminating said transparent layer with said exposure light transmitted through said lens.

5. The optical element manufacturing method according to claim 4, wherein one or more of said lenses is disposed above said mask surface.

6. The optical element manufacturing method according to claim 1, wherein said exposure light is collimated light; and
   said method further comprises, after applying said exposure light from one direction, applying said exposure light from a different direction.

7. An optical element manufacturing method comprising:
   disposing a mask on a transparent photosensitive resin;
   patterning said transparent resin by applying an exposure light to said transparent photosensitive resin through said mask to form a transparent layer;
   forming a light absorbing layer by filling a gap in said transparent layer with a black curable resin; and
   illuminating a mask surface of said mask with said exposure light at an angle that is substantially perpendicular to the surface of said transparent photosensitive resin layer at the center of said transparent photosensitive resin layer and that becomes small toward the edges of said transparent photosensitive resin layer;
   wherein said transparent layer and said light absorbing layer are arranged alternately in a plane and the range of light transmitted through said transparent layer in the direction of the emission of light is restricted by said light absorbing layer.

\* \* \* \* \*